United States Patent [19]

Otani et al.

[11] Patent Number: 5,556,474
[45] Date of Patent: Sep. 17, 1996

[54] PLASMA PROCESSING APPARATUS

[75] Inventors: Satoshi Otani, Osaka; Hiroya Kirimura, Kyoto; Hajime Kuwahara, Kyoto; Takao Tabata, Kyoto; Takahiro Nakahigashi, Kyoto; Hiroshi Murakami, Kyoto, all of Japan

[73] Assignee: Nissin Electric Co., Ltd., Kyoto, Japan

[21] Appl. No.: 357,297

[22] Filed: Dec. 13, 1994

[30] Foreign Application Priority Data

Dec. 14, 1993 [JP] Japan .................................. 5-313086

[51] Int. Cl.⁶ ................................................. C23C 16/00
[52] U.S. Cl. ............... 118/723 E; 156/345; 204/298.07; 204/298.33
[58] Field of Search ........................ 156/345; 118/723 E; 204/298.07, 298.33, 298.11, 298.39

[56] References Cited

U.S. PATENT DOCUMENTS

| | | | |
|---|---|---|---|
| 4,579,618 | 4/1986 | Celestino et al. | 156/345 |
| 4,946,576 | 8/1990 | Dietrich et al. | 204/298.06 |
| 5,113,790 | 5/1992 | Geisler et al. | 118/723 |
| 5,228,968 | 7/1993 | Zejda | 204/298.07 |
| 5,352,294 | 10/1994 | White et al. | 118/725 |
| 5,391,252 | 2/1995 | Taylor | 156/345 |
| 5,399,254 | 3/1995 | Geisler et al. | 204/298.31 |
| 5,423,971 | 6/1995 | Arnold et al. | 204/298.11 |
| 5,424,103 | 6/1995 | Ahn | 427/569 |

FOREIGN PATENT DOCUMENTS

| | | |
|---|---|---|
| 1-100432 | 7/1989 | Japan . |
| 1-106564 | 7/1989 | Japan . |
| 2272995 | 6/1994 | United Kingdom . |

OTHER PUBLICATIONS

Abstract of Japanese Patent No. JP55102239, published Aug. 5, 1980.

Abstract of Japanese Patent No. JP6338470, published Dec. 6, 1994.

"Plasma Particulate Contamination Control. II. Self-Cleaning Tool Design," Journal of Vacuum Science and Technology: Part A, vol. 10 (1992) Jul./Aug., No. 4, Pt. I, New York.

Primary Examiner—R. Bruce Breneman
Assistant Examiner—Joni Y. Chang
Attorney, Agent, or Firm—Nikaido, Marmelstein, Murray & Oram LLP

[57] ABSTRACT

In a plasma processing apparatus, wherein a power application electrode for generating plasma and an electrode opposed thereto are disposed in a process chamber which can be exhausted to attain a predetermined vacuum pressure, an electric power is applied to the power application electrode to generate the plasma from a process gas introduced between the electrodes, and intended plasma processing is effected on a substrate mounted on one of the electrodes in the plasma, the apparatus includes a particle discharge duct which surrounds a periphery and a rear side of the power application electrode and has an opening at a position neighboring to the periphery of the power application electrode, and an exhaust device connected to the duct at a position corresponding to a central portion of the rear side of the power application electrode.

18 Claims, 7 Drawing Sheets

PLASMA PROCESSING APPARATUS

BACKGROUND OF THE INVENTION

1. Field of the Invention

The present invention relates to a plasma processing apparatus such as a plasma chemical vapor deposition apparatus and a plasma etching apparatus, which are used for manufacturing semiconductor devices such as various kinds of sensors using semiconductor materials, thin film transistors, solar batteries and others, and for these purposes, are operable to form a film on a substrate or effect etching on a deposited film in accordance with a predetermined pattern, for example, for forming a wiring pattern.

In the specification and the appended claims, the plasma chemical vapor deposition is referred to also as "plasma-CVD".

2. Description of the Background Art

Various types of plasma-CVD apparatuses have been known.

As a typical example, a parallel plated plasma-CVD apparatus will be described below with reference to FIG. 9. This apparatus has a process chamber 1, in which electrodes 2 and 3 opposed to each other are arranged. The electrode 2 also serves as a substrate holder for mounting a substrate S1 to be processed thereon.

The electrode 2 is generally a ground electrode, and is provided with a heater 21 for heating the substrate S1 mounted on the electrode 2 to a deposition temperature. If radiated heat is used to heat the substrate S1, the heater 21 is separated from the electrode 2.

The electrode 3 is a power application electrode for applying a radio-frequency power or a direct-current power to the deposition gas introduced between the electrodes 2 and 3 for forming plasma from the gas. In this illustrated example, the electrode 3 is connected to a radio-frequency power source 32 via a matching box 31, and is electrically isolated from the process chamber 1.

In the illustrated embodiment, the electrode 3 includes as its component a gas nozzle 33 and a perforated electrode plate 34 provided at the opening of the nozzle 33. The perforated electrode plate 34 is provided with a large number of gas supply ports of about 0.5 mm in diameter, through which a gas supplied from the gas nozzle 33 is discharged entirely into a space between the opposed electrodes. This structure is suitable for deposition of a film on a large area of the substrate.

In the specification and the appended claims, "radio-frequency" may be referred to as "rf", and "radio-frequency power" may be referred to as "rf-power".

The process chamber 1 is also connected to an exhaust pump 52 via a valve 51, and the gas nozzle 33 is connected to a gas supply 4 via a piping. The gas supply 4 includes one or more gas sources 441, 442, ... for supplying a deposition gas via one or more mass-flow controllers 421, 422, ... and valves 431, 432, ..., respectively.

According to the above parallel plated plasma-CVD apparatus, the substrate S1 for deposition is mounted on the electrode 2 in the process chamber 1. The process chamber 1 is maintained at a predetermined vacuum pressure by opening the valve 51 and driving the exhaust pump 52, and the deposition gas is introduced into the chamber 1 from the gas supply 4 through the nozzle 33 and the gas supply ports in the electrode plate 34. The power supply 32 applies an rf-power to the rf-electrode 3 to form plasma from the introduced gas, and an intended film is deposited on the surface of the substrate S1 in the plasma.

Various types of plasma etching apparatuses are also known.

Figure 10:
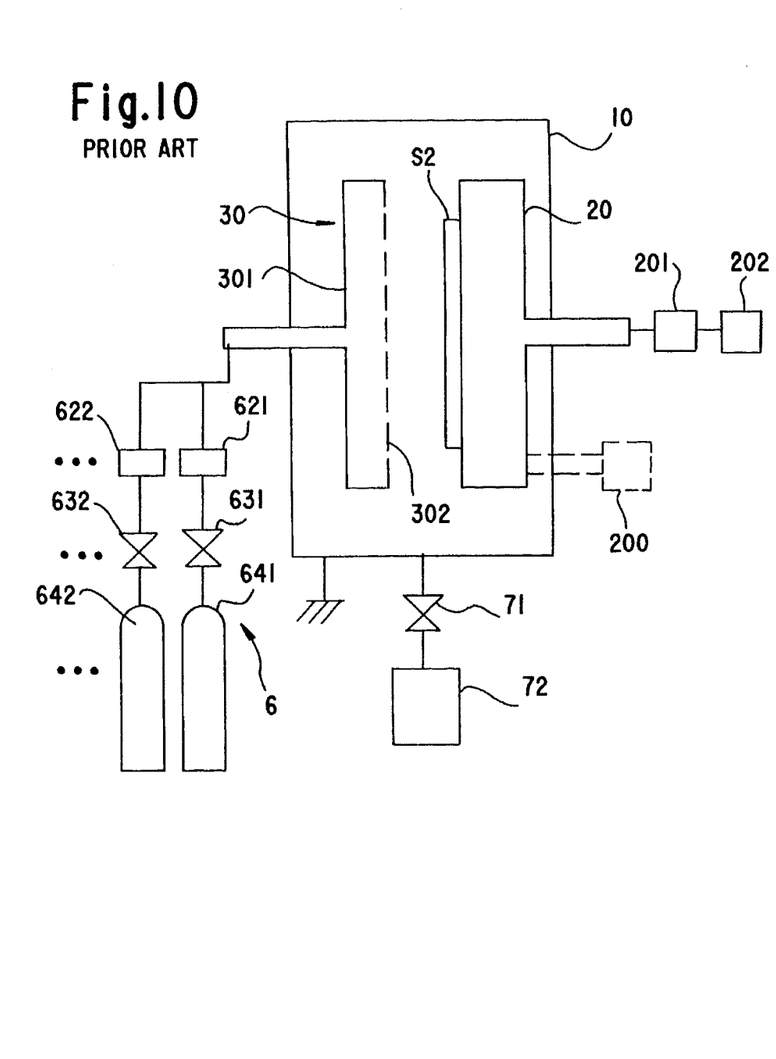
FIG. 10 shows a schematic structure of a conventional plasma etching apparatus.

As a typical example, a parallel-plated etching apparatus will be described below with reference to FIG. 10. This apparatus includes a process chamber 10, in which electrodes 20 and 30 opposed to each other are arranged. The electrode 20 serves also as a substrate holder for mounting a substrate S2 on which a film to be etched is formed.

The electrode 20 serves as a power application electrode for applying an rf-power or a DC power to an etching gas introduced between the electrodes 20 and 30 so as to form plasma. In the illustrated example, the electrode 20 is connected to an rf-power supply 202 via a matching box 201, and is electrically isolated from the process chamber 10.

The electrode 30 is a ground electrode, and includes as its component a gas nozzle 301 and a perforated electrode plate 302 provided at the opening of the nozzle 301. The perforated electrode plate 302 is provided with a large number of gas supply ports of about 0.5 mm in diameter, through which a gas supplied from the gas nozzle 301 is discharged entirely into a space between the opposed electrodes.

The process chamber 10 is also connected to an exhaust pump 72 via a valve 71, and the gas nozzle 301 is connected to a gas supply 6 via a piping. The gas supply 6 includes one or more gas sources 641, 642, ... for supplying a etching gas via one or more mass-flow controllers 621, 622, ... and valves 631, 632, ..., respectively.

According to the above etching apparatus, the substrate S2 to be processed is mounted on the rf-electrode 20 in the process chamber 10. The chamber 10 is maintained at a predetermined vacuum pressure owing by opening the valve 71 and driving the exhaust pump 72, and the etching gas is introduced into the chamber 10 from the gas supply 6 through the nozzle 301 and the gas supply ports in the electrode plate 302. The rf-power supply 202 applies an rf-power to the electrode 20 to form plasma from the introduced gas, and the film on the substrate S2 is etched in the plasma. The electrode 20 may be cooled with a water-cooling device 200 or the like, if necessary.

The plasma CVD-apparatus described above presents such problems that particles which become dust are generated by gas phase reaction in the plasma, and the particles adhere to or are mixed into the film formed on the surface of the substrate, resulting in deterioration of the film quality, and that the particles thus generated adhere to various portions in the process chamber, causing contamination. Since the particles once adhered to the various portions in the process chamber may be separated therefrom and adhere to the substrate to be processed, they must be cleaned off before separation, which requires a time-consuming operation.

In particular, generation of particles by the gas phase reaction and growth thereof are likely to occur especially in such cases that an amorphous silicon film is formed from monosilane ($SiH_4$) and hydrogen ($H_2$), an amorphous silicon nitride film is formed from monosilane and ammonia ($NH_3$), and an amorphous silicon oxide film is formed from monosilane and nitrous oxide ($N_2O$). For example, if the particles adhering to or mixed into the film deposited on the substrate surface have a size relatively larger than a film thickness of the deposited film, portions of the film containing the particles will form pin holes when cleaned after the deposition, so that, if the film is to be used as an insulating film, failure in insulation properties occurs, and, if the film is to be used as a semiconductor film, semiconductor characteristics are impaired.

Likewise, the plasma etching apparatus presents such disadvantages that particles which become dust are formed by the gas phase reaction and adhere to the etching surface or portions in the process chamber.

For example, if etching is performed for forming an interconnection or wiring pattern, such particles deteriorate the patterning accuracy, and may break an extremely thin line or interconnection.

The above disadvantages may impede high-speed deposition and high-speed etching, which generate many particles, and the particles impede stable formation of the plasma, so that failure in deposition and etching may be caused.

SUMMARY OF THE INVENTION

Accordingly, it is an object of the invention to provide a plasma processing apparatus, which allows efficient removal of particles generated by gas phase reaction in plasma so that adhesion of the particles to a substrate to be processed and inner portions of a process chamber is suppressed, plasma processing at a higher speed is allowed, plasma is stabilized and failure in the plasma processing is suppressed. The expression "adhesion of the particles to a substrate" used above and later conceptionally includes, in the case of film deposition, direct adhesion of the particles to the surface of the substrate, and adhesion of the particles to and mixture of the particles into the deposited film as well as, in the case of etching, direct adhesion of the particles to the surface of the substrate, and adhesion of the particles to and mixture of the particles into the film to be etched.

In order to achieve the above object, the inventors have studied and found that the particles generated during the plasma processing have a tendency to be collected at the vicinity of a power application electrode, and particularly at a periphery of the electrode, and further particularly at an electrode edge of the periphery near a plasma generation region. Based on these findings, the invention has been developed.

In order to overcome the above-noted disadvantages, the present invention provides a plasma processing apparatus, wherein a power application electrode for generating plasma and an electrode opposed thereto are disposed in a process chamber which can be set to a predetermined vacuum pressure by an exhaust device, an electric power is applied to the power application electrode to generate the plasma from a process gas introduced between the electrodes, and intended plasma processing is effected on a substrate mounted on one of the electrodes in the plasma, the apparatus comprising a particle discharge duct which surrounds a periphery and a rear side of the power application electrode and has an opening at a position neighboring to the periphery of the power application electrode, and exhaust means connected to the duct at a position corresponding to a central portion of the rear side of the power application electrode.

The exhaust means for the duct may be formed of the exhaust device for setting the process chamber to the predetermined vacuum pressure. Alternatively, for smooth exhaust from the duct, the exhaust means for the duct may be formed of dedicated means.

The opening portion provided at the duct for collecting the particles may have various forms, and, for example, may be formed of a large number of uniformly spaced apertures having the substantially same size and shape. Alternatively, the opening portion may be formed of an intermittently or continuously extended slit(s) or the like. However, it is desirable to form the opening portion which can perform uniform exhaust from the entire or wide range in the duct for efficient removal of the particles which are liable to be collected at the edge of the power application electrode.

For the optimum removal of the particles from a whole or wide area in the plasma generation region, the duct may be extended to surround the plasma generation region between the electrodes, and the duct opening may be extended to a position confronting the plasma generation region.

In order to suppress reverse diffusion of the particles from the duct into the process chamber, a heater may be associated to the duct for heating and changing the particles into a film adhering to the duct.

In any one of the above cases, potential applying means for applying a potential so as to collect the particles at the opening of the duct may be connected to the duct. In this case, the potential applying means may be formed of various means such as grounding means and means for applying a predetermined potential other than the ground potential, depending on the charged state of the particles.

At the duct opening, there may be provided a perforated electrically conductive member, which can set the duct opening to the same potential as a duct body for generating stable plasma and avoiding irregularity in the electric field at the duct opening. This member may be selected from various members such as a plate provided with many apertures, a net-like member, a lattice-like member and combination of them.

The above perforated conductive member can be also used in the structure in which the means for applying the potential to the duct opening portion is connected to the duct.

In any one of the above cases, the edge of the periphery of the power application electrode near the plasma generation region may be chamfered along the direction of suction of the particles by the duct, and/or the edge of the opening portion of the duct adjacent to the periphery of the power application electrode may be chamfered along the direction of suction of the particles by the duct, so that the particles can be discharged effectively into the duct owing to a gradient of the electric field intensity. The chamfer may be flat or of other form such as a round form.

The duct, for example, may be grounded. However, in the film deposition apparatus, a range of deposition conditions which can achieve sufficient uniformity of the deposited film is restricted, and hence the grounding may adversely affect the film quality in some cases. Also, in the etching apparatus, a range of etching conditions which can achieve sufficient uniformity of the etching rate is restricted in some cases. In these cases, the duct may be electrically isolated from the power application electrode and the ground to attain a floating state, if necessary. For attaining this floating state, the duct may be made of an electrical insulator such as glass, glass ceramics, alumina or the like.

If the duct is made of an electrically conductive material, the duct may be electrically isolated from both the power application electrode and the ground to attain the floating state, if necessary. In this case, insulating means, i.e., an insulating spacer made of, e.g., glass, glass ceramics, alumina or the like may be arranged at a position between the duct and the power application electrode and a position between the duct and the grounded process chamber.

In any of the above cases, if the power application electrode has a square pole form, purge gas introducing means may be provided at a portion of the duct corresponding to the corner of the electrode for preventing accumulation of the particles at this portion. The purge gas may be any gas provided that it does not impede the plasma processing. The purge gas may be supplied by controlling its flow rate and pressure such that the purge gas can be externally discharged together with the particles by the exhaust means from the duct.

As typical and specific examples of the plasma processing apparatus of the invention described above, one can mention a plasma-CVD apparatus and a plasma etching apparatus.

According to the plasma processing apparatus of the invention, the exhaust from the particle discharge duct is performed by the exhaust means connected thereto, so that the particles generated by the gas phase reaction during the plasma processing, and particularly particles, which are generated at the vicinity of the power application electrode and are liable to be collected at the electrode edge, are efficiently removed through the opening of the duct and discharged from the plasma generation region. In the structure where the duct extends to surround the plasma generation region between the electrodes, and the duct opening extends to confront the plasma generation region, the particles can be removed and discharged further effectively from the entire plasma generation region.

In the structure where the heater is associated to the duct, the heater can operate to suppress reverse diffusion of the particles from the duct into the process chamber.

In the structure where the potential applying means for applying a potential is connected to the duct, the potential applying means can apply an appropriate potential to the opening portion of the duct depending on the charged state of the particles, so that the particles can be collected and hence discharged further efficiently.

In the structure where the perforated conductive member is associated to the opening of the duct, the plasma can be stabilized, and irregularity in the electric field at the duct opening can be avoided.

In the structure where the edge of the periphery of the power application electrode near the plasma generation region is chamfered along the direction of suction of the particles, and/or the edge of the opening portion of the duct adjacent to the periphery of the power application electrode is chamfered along the direction of suction of the particles, the particles are efficiently moved owing to the gradient of the electric field intensity formed by the chamfering.

In the structure where the duct is made of the electrically insulating material, or the duct is made of the electrically conductive material and is electrically isolated from both the power application electrode and the ground, the duct is electrically floated from the electrode and the ground. Therefore, when the plasma is generated between the electrode supplied with the power and the electrode opposed thereto, the duct is electrically charged in accordance with the plasma, resulting in reduced potential gradient between the potentials of the duct and the plasma space. As a result, it is possible to suppress change of the state of the plasma, which may be caused by provision of the duct, so that, in the plasma-CVD, the uniformity of the deposited film is improved, and, in the plasma etching, the uniformity of the etching rate is improved.

In the structure where the power application electrode has the square pole form, and the purge gas introducing means for preventing accumulation of the particles is provided at the portion of the duct corresponding to the corner of the electrode, the purge gas can be introduced into the duct from the purge gas introducing means, so that the particles which tend to be accumulated at the above portion are smoothly discharged from the duct.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
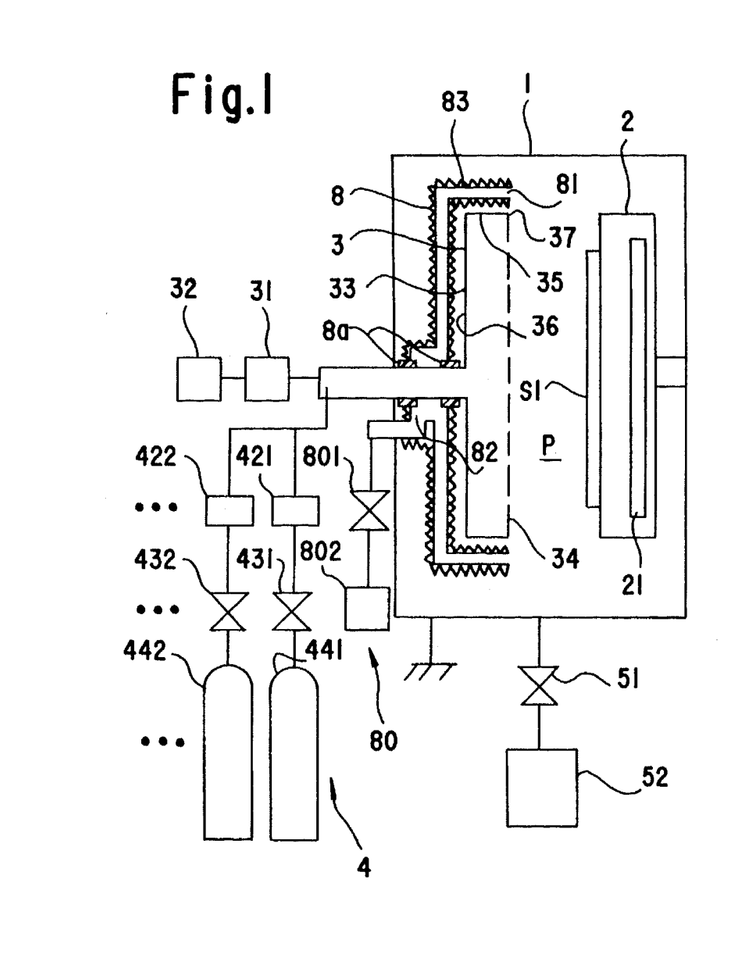
FIG. 1 shows a schematic structure of a plasma-CVD apparatus of an embodiment of the invention.

Embodiments of the invention will be described below with reference to the drawings. FIG. 1 shows a plasma-CVD apparatus of an embodiment of the invention.

Figure 9:
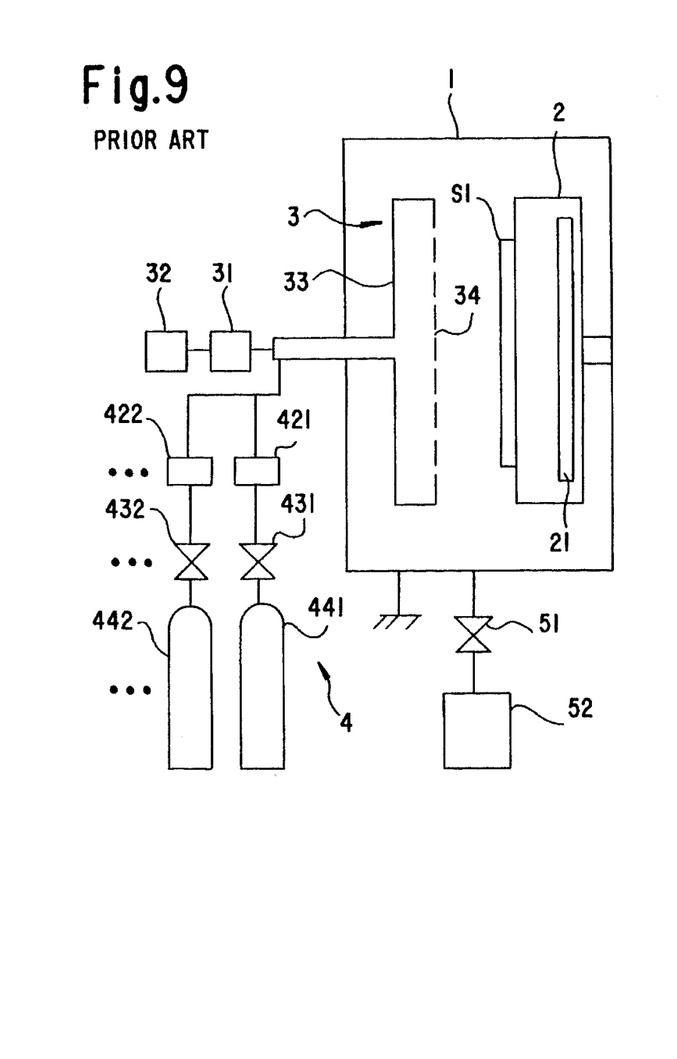
FIG. 9 shows a schematic structure of a conventional plasma-CVD apparatus.

The plasma CVD apparatus in FIG. 1 differs from the conventional apparatus shown in FIG. 9 in that it includes a duct 8 for discharging particles which surrounds an rf-electrode 3 and is connected to an exhaust device 80. Structures other than the provision of the duct 8 and the exhaust device 80 are the substantially same as those shown in FIG. 9, and the deposition is conducted in the similar manner as a whole. Parts and portions similar to those in the apparatus shown in FIG. 9 bear the same reference numbers. In this embodiment, the rf-electrode 3 and the ground electrode 2 each have a square pole form. Therefore, the duct 8 has a square section corresponding to the electrode 3.

The duct 8 integrally surrounds a periphery 35 and a rear portion 36 of the rf-electrode 3, and has an opening 81 at a position adjacent to an electrode edge 37 of the periphery 35 confronting a plasma generation region P. More specifically, the duct opening 81 has a slit-like form, is disposed on the substantially same plane as an electrode plate 34 and the edge 37 of the electrode 3, and surrounds the electrode 3. The duct 8 is provided at a position corresponding to a rear central portion of the electrode 3 with a connection port 82 for connection to the exhaust device 80. In this embodiment, the duct 8 is made of an electrically conductive material, is electrically isolated from the electrode 3 by a spacer 8a, and is grounded via a process chamber 1.

The duct 8 is additionally provided with a heater 83, which extends up to the portion of the duct having the opening 81 and hence can heat also the opening portion.

The exhaust device 80 includes an exhaust regulator valve 801 and an exhaust pump 802. The pump 802 is connected to the connection port 82 of the duct 8 via the valve 801.

According to the plasma-CVD apparatus, a substrate S1 to be processed is mounted on the electrode 2, and thereafter, steps similar to those already described with reference to the apparatus shown in FIG. 9 are executed to deposit an intended film on the substrate surface.

In this apparatus, however, exhaust through the duct 8 surrounding the rf-electrode 3 is performed by the exhaust device 80 during the deposition process. Therefore, during deposition, dust particles generated by the gas phase reaction in the plasma, and particularly particles, which are generated at the vicinity of the rf-electrode 3 and tend to be collected at the vicinity of the electrode edge 37, are efficiently removed from through the opening 81 of the duct 8 into the duct 8, and are discharged from the plasma region.

This suppresses adhesion of the particles to the substrate S1 and portions of the process chamber 1, so that defects in the deposited film are remarkably suppressed, and frequent maintenance such as cleaning of the respective portions of the process chamber for removing the particles is not required as compared with the prior art, resulting in improvement of a throughput. Further, high-speed deposition, which causes a large amount of particles, can be performed. By efficiently removing the particles, the plasma can be stabilized, and process failure, which is liable to be caused due to unstable plasma, can be suppressed.

The heater 83 is operated, if necessary, so that the particles are suppressed from reversely diffusing into the plasma region.

Figure 2:
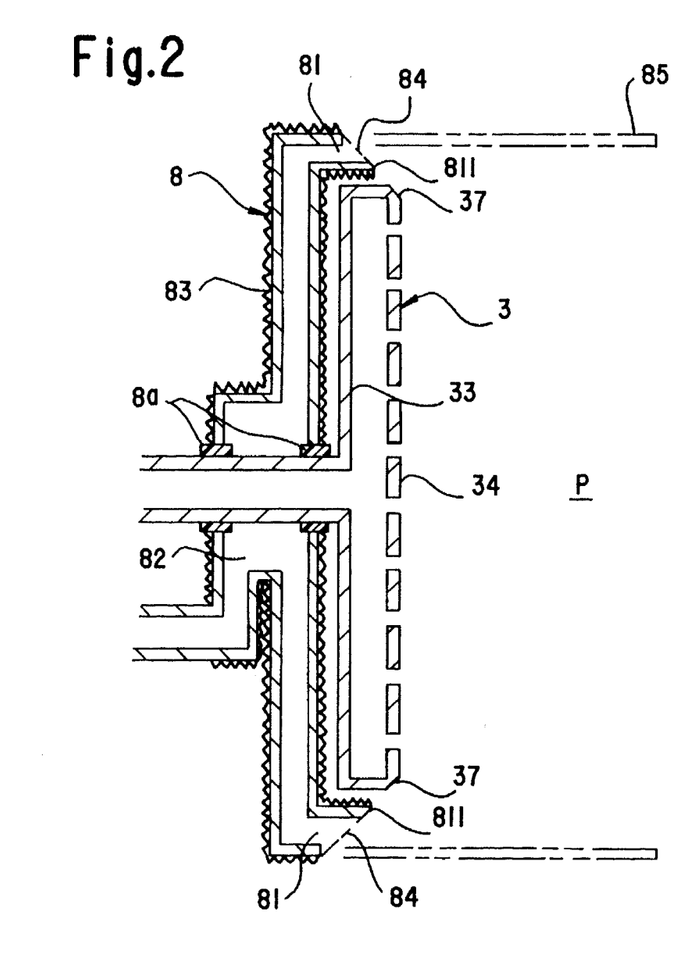
FIG. 2 is a cross section showing an rf-electrode and a particle discharge duct surrounding it of a plasma-CVD apparatus of another embodiment of the invention.

FIG. 2 is a cross section showing a plasma-CVD apparatus of another embodiment of the invention. The plasma-CVD apparatus shown in FIG. 2 corresponds to partial modification of the plasma-CVD apparatus shown in FIG. 1. More specifically, the edge 37 of the rf-electrode 3 is obliquely chamfered in the direction of suction of the particles by the duct 8, and an edge 811 of the duct opening 81 adjacent to the edge 37 is chamfered in the same direction. These chamfered surfaces are aligned on the substantially same surface. An electrically conductive member 84 having a mesh-like form is arranged at the duct opening 81. This member 84 are arranged on the substantially same surface as the chamfered surfaces. Structures other than the above are the same as those shown in FIG. 1. Parts and portions similar to those in FIG. 1 bear the same reference numbers.

According to this apparatus, the chamfers at the electrode edge 37 and the duct opening edge 811 cause gradient in the intensity of the electric field, whereby the particles are moved efficiently into the duct. Since the mesh-like conductive member 84 is arranged at the duct opening 81, the plasma is further stabilized, and irregularity in the electric field at the duct opening can be avoided.

As indicated by alternate long and two short dashes line in FIG. 2, an outer wall 85 of the duct 8 may be extended to surround the plasma region P, whereby the particles can be moved into the duct 8 more smoothly.

Figure 3:
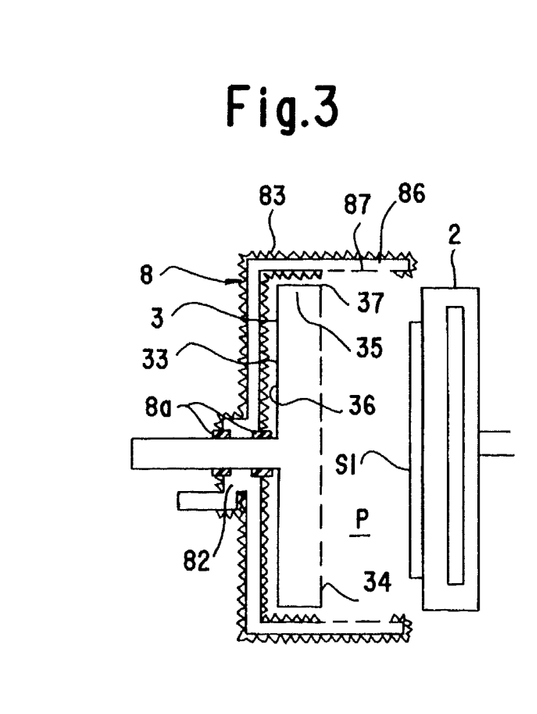
FIG. 3 fragmentarily shows a plasma-CVD apparatus of still another embodiment of the invention.

FIG. 3 fragmentally shows a plasma-CVD apparatus of still another embodiment of the invention. The plasma-CVD apparatus shown in FIG. 3 corresponds to partial modification of the plasma-CVD apparatus shown in FIG. 1. More specifically, the duct 8 has an extended cylindrical portion which surrounds the plasma generation region P between the rf-electrode 3 and the substrate carrier electrode 2, and a duct opening 86 is also extended to surround the plasma generation region. The duct opening 86 is provided with a mesh-like electrically conductive member 87 particularly in such a manner that the surface of the member 87 is substantially flush with the surface of the duct body so as to minimize a difference in surface level. The heater 83 is extended up to an extended portion of the duct 8 around the plasma generation region P. Structures other than the above are the same as those of the apparatus shown in FIG. 1. The same portions and parts as those in FIG. 1 bear the same reference numbers.

According to this apparatus, the duct body and its opening are extended to surround the plasma generation region P, so that the particles can be efficiently moved into the duct 8 from the whole plasma generation region for discharging them. Since the mesh-like conductive member 87 is arranged at the duct opening 86, the opening portion attains the same potential as that of the duct body, so that the plasma is stabilized, and irregularity in the electric field at the duct opening portion can be avoided.

Figure 4:
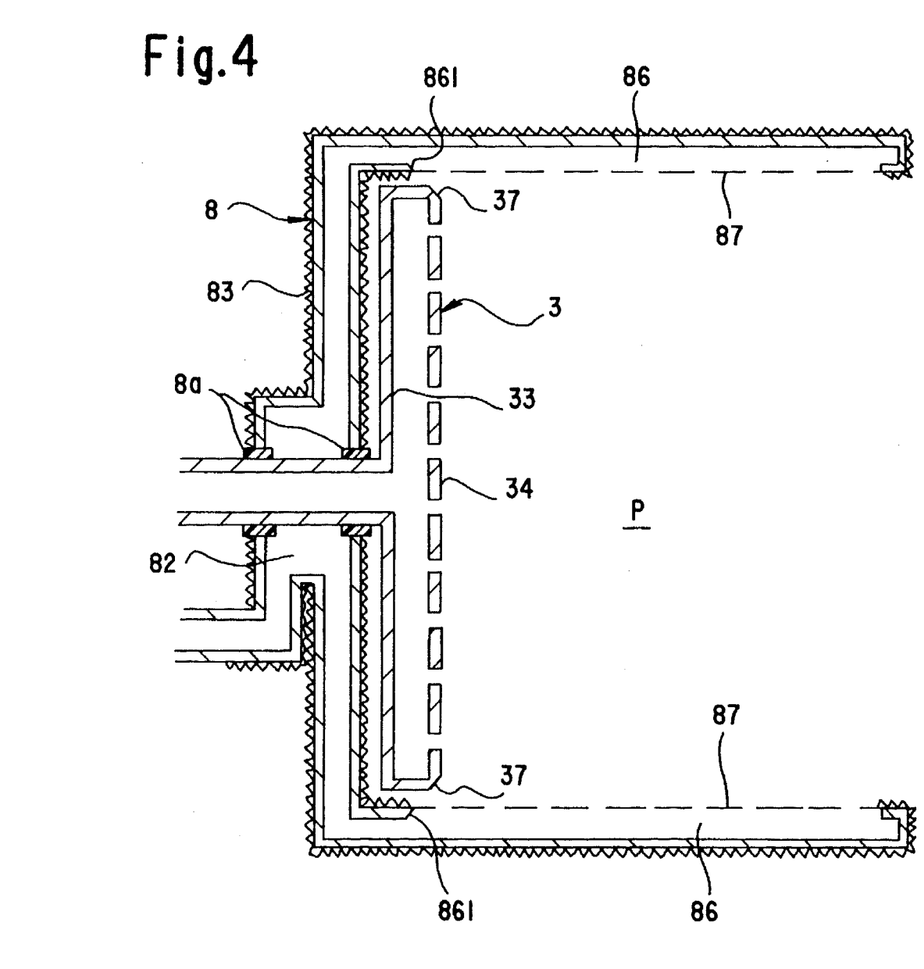
FIG. 4 is a cross section showing an rf-electrode and a particle discharge duct surrounding it of a plasma-CVD apparatus of yet another embodiment of the invention.

FIG. 4 is a cross section showing a plasma-CVD apparatus of yet another embodiment of the invention. The apparatus shown in FIG. 4 differs from the apparatus shown in FIG. 3 in that the electrode edge 37 is obliquely chamfered in the direction of suction of the particles by the duct 8, and an edge 861 of the duct opening 86 adjacent to the edge 37 is chamfered in the same direction. Both the chamfered surfaces are located on the substantially same plane. Structures other than the above are the same as those of the apparatus shown in FIG. 3. The same portions and parts as those in FIG. 3 bear the same reference numbers.

According to this apparatus, the chamfers at the electrode edge 37 and the duct opening edge 861 cause gradient in the intensity of the electric field, whereby the particles are moved efficiently into the duct 8.

A plasma-CVD apparatus of further another embodiment of the invention, although not shown, differs from the plasma-CVD apparatus shown in FIG. 1 in that the duct 8 is made of an electrically insulating material. A spacer 8a for electrically isolating the duct 8 and the power application electrode 3 from each other is eliminated. Structures other than above are the same as those of the apparatus shown in FIG. 1.

According to this embodiment, the duct 8 is charged in accordance with generation of the plasma, and a potential gradient between the potentials of the duct 8 and the plasma space can be smaller than that in the apparatus in FIG. 1, in which the duct 8 is made of a conductive material and is grounded. In the deposition by the apparatus shown in FIG. 1, the potential gradient formed between the duct 8 and the plasma generation region P may cause change in the plasma state such as compression of the plasma. However, the apparatus of further another embodiment of the invention described above can suppress this change of state, and can improve the uniformity of the deposited film. This increases a range of the deposition conditions which can achieve the intended uniformity, and also improves the film quality. Further, concentration of the electric field at the duct 8 can be prevented, so that the duct 8 can be disposed close to the electrode 3 within a range allowing sufficient exhaust, whereby the size and cost of the apparatus can be reduced.

Figure 5:
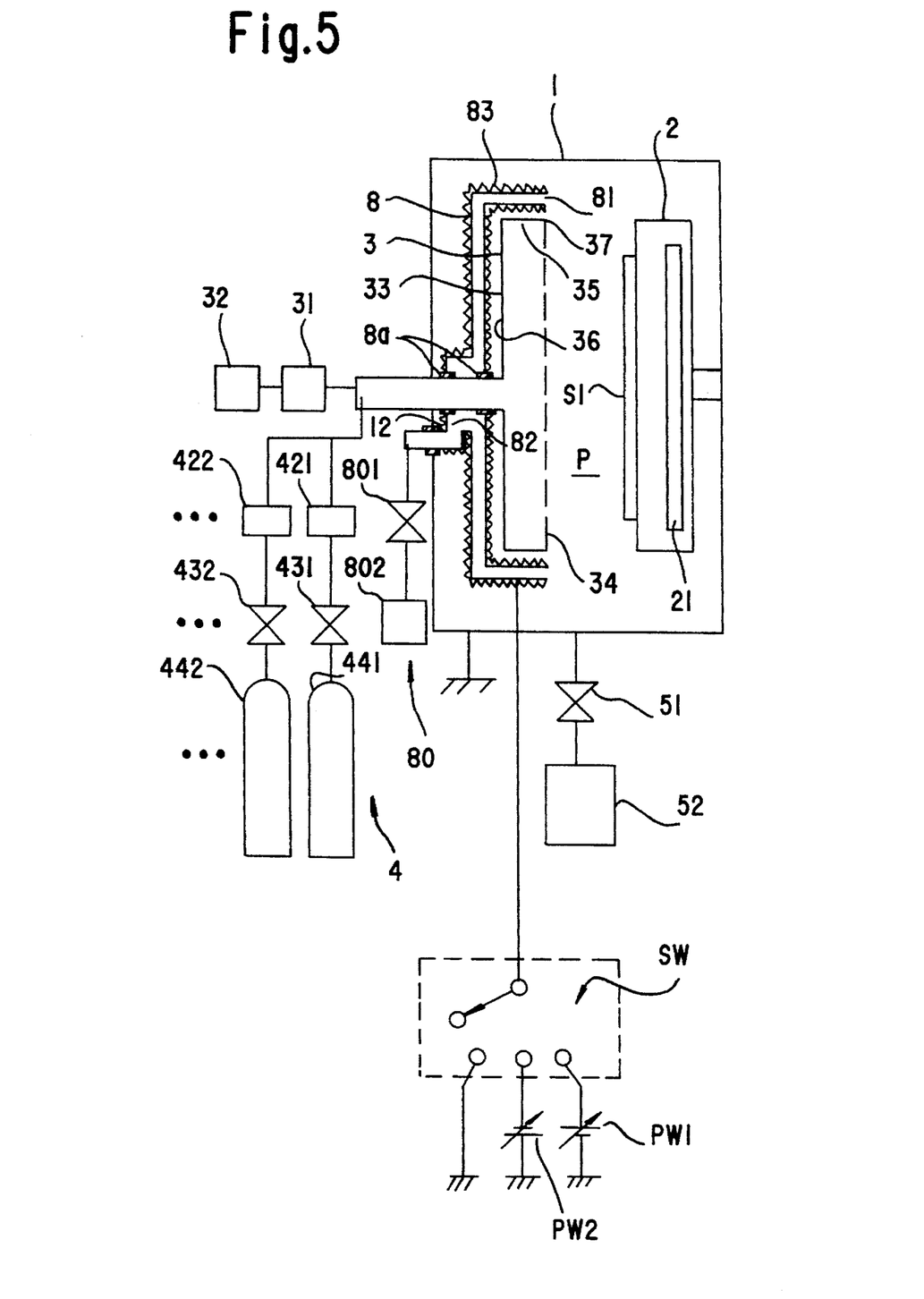
FIG. 5 shows a schematic structure of a plasma-CVD apparatus of further another embodiment of the invention.

FIG. 5 shows a plasma-CVD apparatus according to further another embodiment of the invention. This apparatus shown in FIG. 5 differs from the plasma-CVD apparatus shown in FIG. 1 in that the insulating spacer 8a and an additional insulating spacer 12 are fitted to the duct 8, so that insulation is achieved not only between the duct and the rf-electrode 3 but also between the duct 8 and the process chamber 1. The conductive duct 8 may be selectively connected via a selector switch SW to a power source PW1 for applying a positive potential or a power source PW2 for applying a negative potential, may be grounded, or may be electrically floated. Other structures are the same as those in the apparatus shown in FIG. 1.

According to this apparatus, if the duct 8 is electrically floated, the apparatus can achieve the effects similar to those by the plasma-CVD apparatus including the duct 8 made of an electrically insulating material. If the duct 8 is connected to the power source PW1 or PW2 in accordance with the charged state of the dust particles, or is grounded, and the potential is applied to the duct opening portion, the charged particles can be collected efficiently to the duct opening.

Figure 6A:
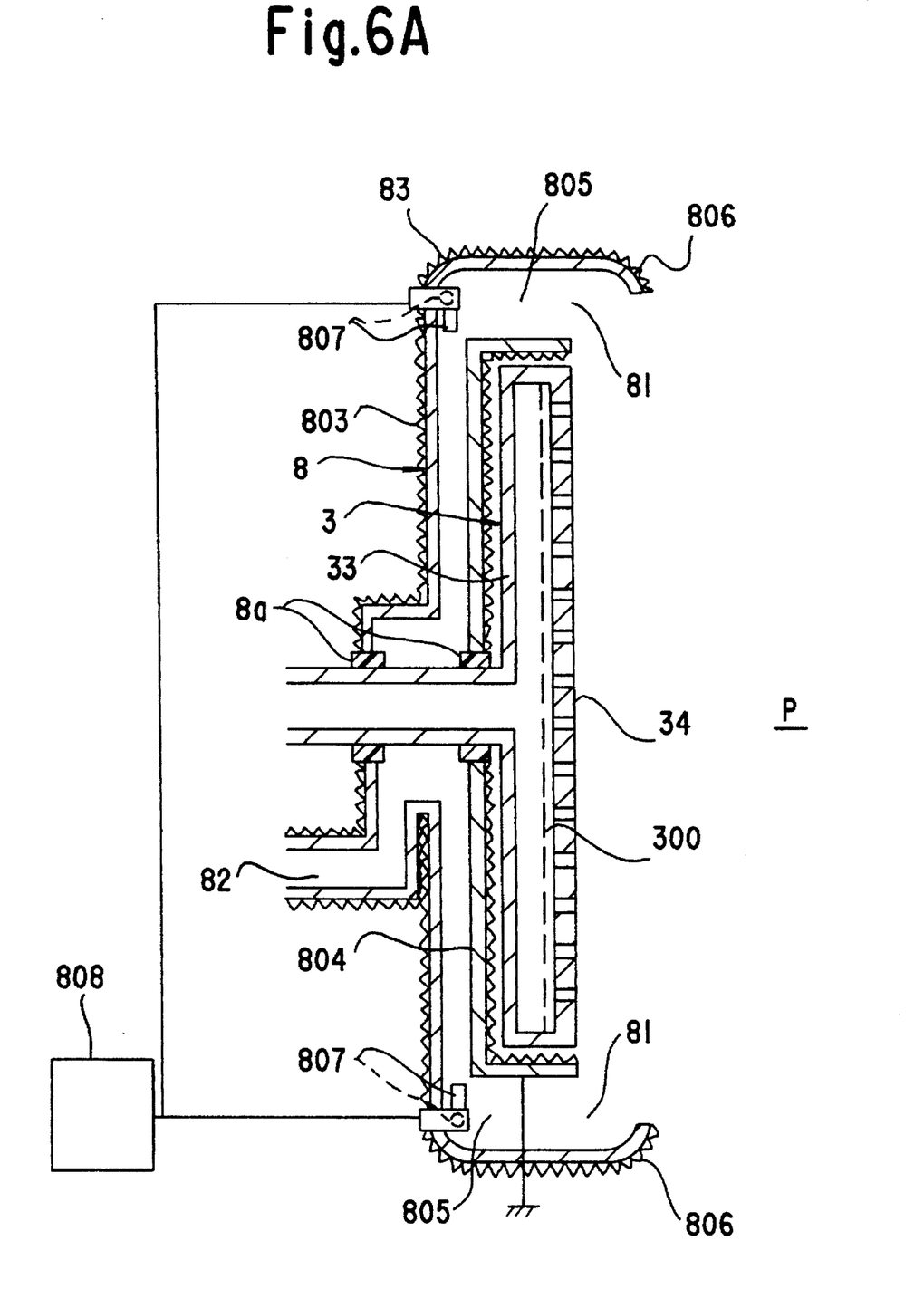
FIG. 6A is a cross section showing an rf-electrode and a particle discharge duct surrounding it of a plasma-CVD apparatus of further another embodiment of the invention.
Figure 6B:
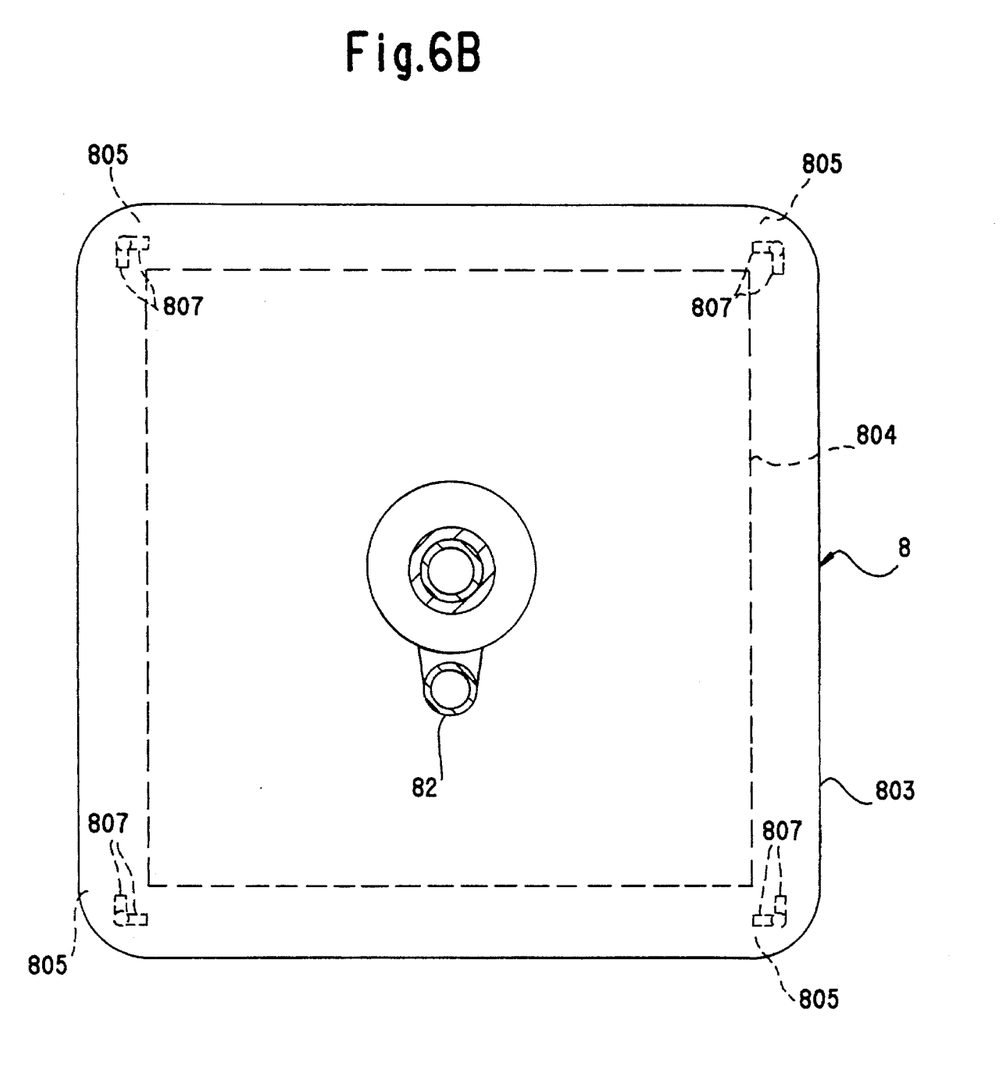
FIG. 6B is a rear view showing the duct in FIG. 6A.

FIGS. 6A and 6B are a cross section and a rear view fragmentally showing a plasma CVD apparatus according to further another aspect of the invention. This apparatus differs from the plasma-CVD apparatus shown in FIG. 1 in that the rf-electrode 3 and the duct 8 surrounding it are partially modified. In this apparatus, as shown in FIGS. 6A and 6B, duct portions (duct corners) 805 corresponding to the respective corners of the rf-electrode 3 having the square pole form are defined by duct outer wall 803 of which inner surfaces are rounded for promoting a flow of the particles. A duct outer wall portion 806 defining the duct opening 81 is slightly extended up to the plasma region P, and is inwardly curved toward the electrode 3 for smoothly flowing the particles. Further in this apparatus, the duct outer wall 803 forming the duct 8 is electrically floated with respect to the process chamber 1 and the electrode 3, and the duct inner wall 804 is grounded. A perforated plate 300 provided in the gas nozzle 33 is a gas distribution plate. Each corner 805 of the duct 8 corresponding to the corner of the electrode 3 is provided with two purge gas introduction pipes 807 as an example of the purge gas introducing means. Each pipe 807 is arranged such that the particles having a tendency to stay at the duct corners 805 are moved smoothly toward the connection port 82 to which the exhaust device 80 is connected, and each pipe 807 is connected to a purge gas supply device 808.

Structures other than the above are the same as those of the plasma-CVD apparatus in FIG. 1.

According to this apparatus, the particles are smoothly brought into the duct owing to the curved shape of the outer wall portion 806 of the duct opening 81, and then the dust particles which tend to stay at the duct corners 805 are smoothly moved toward the exhaust device connection port 82 owing to injection of the purge gas from the purge gas introduction pipes 807. In this manner, the particles are smoothly discharged.

In any of the aforementioned structures which includes the duct 8 made of the electrically insulating material, or the duct 8 made of the electrically conductive material and the insulating spacers and/or the purge gas introducing means, the electrode edge 37 and/or the duct opening edge may be chamfered and/or the duct may be extended to surround the plasma generation region as shown in FIGS. 2, 3 and 4.

Description will now be given on an example 1, in which amorphous hydrogenated silicon (which will also be referred to as "a-Si:H") film was formed by the apparatus shown in FIG. 3.

[EXAMPLE 1]

Deposition Conditions

Substrate: Silicon Wafer of 5 inch in diameter
Deposition Gas: Monosilane ($SiH_4$) 100 sccm Hydrogen ($H_2$) 400 sccm
Deposition Temperature: 230° C.
Deposition Gas Pressure: 0.4 Torr
rf-Power: 200 W
Electrode size: 360 mm×360 mm
Space between electrodes: 45 mm (more accurately, distance between electrode 3 and surface of substrate S1)
Exhaust rate: Exhaust device (51, 52): exhaust device 80=10:1
Duct temperature: about 200° C.
Duct material: Stainless steel
Duct opening conductive member 87: mesh plate of stainless steel having opening rate of 70%

In the deposition, particles adhered to the deposited a-Si:H film and having a diameter of 0.3 μm or more were 5 or fewer in number, the deposition rate was 200 Å/min, and the maintenance of the process chamber was required every 50 batches.

For comparison, the deposition was conducted by the conventional apparatus shown in FIG. 9 under the same conditions as the above except for that the duct 8 is not employed. In the result, particles adhered to the deposited film were about 50 in number, the deposition rate was 100 Å/min, and the maintenance of the process chamber was required every 10 batches.

Description will now be given on an example 2 in which a-Si:H film was formed by the apparatus including the duct 8 made of the insulating material similarly to the modification of the apparatus shown in FIG. 1, and extended to surround the plasma generation region P similarly to the apparatus shown in FIG. 3 (but was not provided with the conductive mesh member 87).

[EXAMPLE 2]

Deposition Conditions

Substrate: Glass substrate of 200 mm×200 mm
Deposition Gas: Monosilane ($SiH_4$) 100 sccm Hydrogen ($H_2$) 400 sccm
Deposition Temperature: 230° C.
Deposition Gas Pressure: 0.35 Torr
rf-Power: 200 W
Electrode size: 360 mm×360 mm
Space between electrodes: 45 mm (more accurately, distance between electrode 3 and surface of substrate S1)
Exhaust: Only by exhaust device 80
Duct temperature: about 200° C.
Duct material: Heat-resistant glass Uniformity of the film was measured at 64 points on the substrate S1 on which the a-Si:H film was deposited under the above conditions. The result is about ±5%.

Further, a-Si:H film was deposited on the substrate S1 by the apparatus used in the example 2 under the same conditions as the example 2 except for that the duct was made of an electrically conductive material, i.e., stainless steel (SUS304) and was grounded. The measured uniformity was about ±7%.

Description will now be given on a plasma-etching apparatus of further another embodiment shown in FIG. 7. This apparatus differs from the conventional etching apparatus shown in FIG. 10 in that an rf-electrode 20 is associated with and surrounded by a duct 9 for discharging particles, which is connected to an exhaust device 90. Structures other than provision of the duct 9 and the exhaust device 90 are the substantially same as those in the apparatus shown in FIG. 10, and the etching is performed in the similar manner as a whole. The same parts and portions as those in the apparatus in FIG. 10 bear the same reference numbers. The electrodes 20 and 30 in this embodiment each have a square pole form, and correspondingly, the duct 9 has a square section around the electrode 20.

The duct 9 integrally surrounds a periphery 203 and a rear side 204 of the rf-electrode 20, and has an opening at a portion neighboring to an electrode edge 205 of the electrode periphery 203 confronting the plasma generation region P. More specifically, the duct opening 91 has a slit-like form, is located on the substantially same plane as the edge 205 and surface of the electrode 20 near the plasma generation region P, and surrounds the electrode 20. The duct 9 is provided at a position corresponding to a rear central portion of the electrode 20 with a connection port 92 for connection to the exhaust device 90. In this embodiment, the duct 9 is made of an electrically conductive material, is electrically isolated from the electrode 20 by spacers 13, and is grounded via the process chamber 1.

The duct 9 is associated with a heater 93, which is extended up to the portion of the duct having the opening 91 for heating the opening portion.

The exhaust device 90 includes an exhaust regulator valve 901 and an exhaust pump 902. The pump 902 is connected to the connection port 92 of the duct 9 via the valve 901.

In the above plasma etching apparatus, the substrate S2 is mounted on the electrode 20, and thereafter, the same steps as those by the apparatus (shown in FIG. 10) already described are executed to effect the etching on the film on the substrate surface.

In this etching apparatus, however, the exhaust device 90 performs the exhaust from the duct 9 surrounding the rf-electrode 20 during the etching. Therefore, during the etching, particles, which are generated by the gas phase reaction in the plasma, and particularly at the vicinity of the electrode 20, and tend to be collected at the vicinity of the electrode edge 205, are efficiently moved through the opening 91 of the duct 9 into the duct, and are discharged from the plasma region. This suppresses adhesion of the particles to the substrate S2 and the respective portions in the process chamber 1, so that the failure in etching is remarkably suppressed, and the frequency of the required maintenance, e.g., for removing the particles from the respective portions in the process chamber can be reduced as compared with the prior art, which improves the throughput. Further, the apparatus allows high-speed etching which generates a large amount of particles, and can stabilize the plasma owing to discharge of the particles, so that failure in etching, which may be caused by the unstable plasma, can be suppressed.

If necessary, the heater 93 is operated to suppress diffusion of the particles from the duct 9 to the plasma region.

Figure 7:
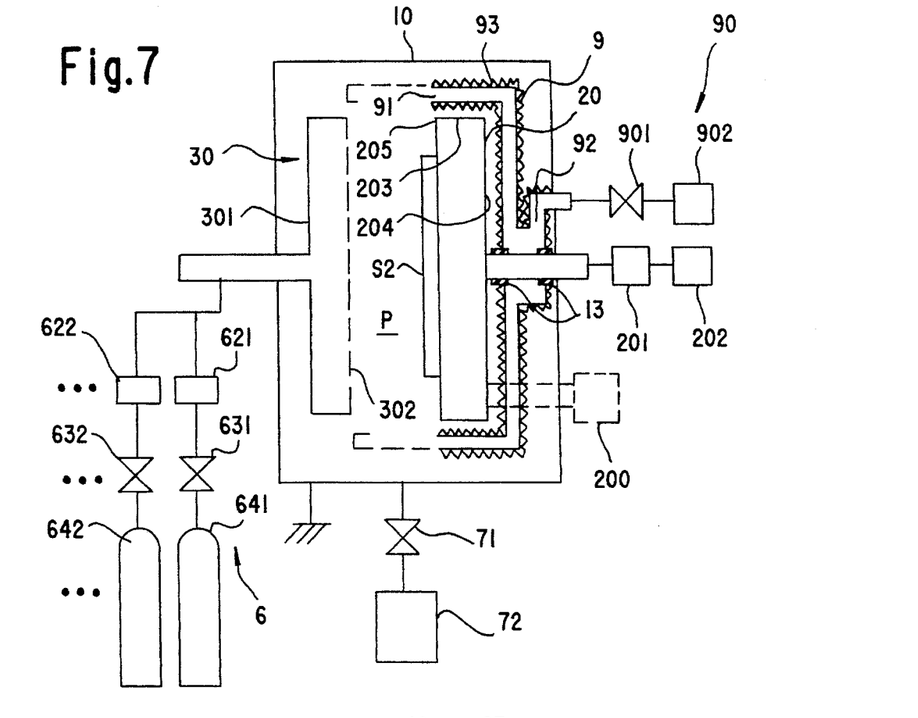
FIG. 7 shows a schematic structure of a plasma etching apparatus of further another embodiment of the invention.
Figure 8:
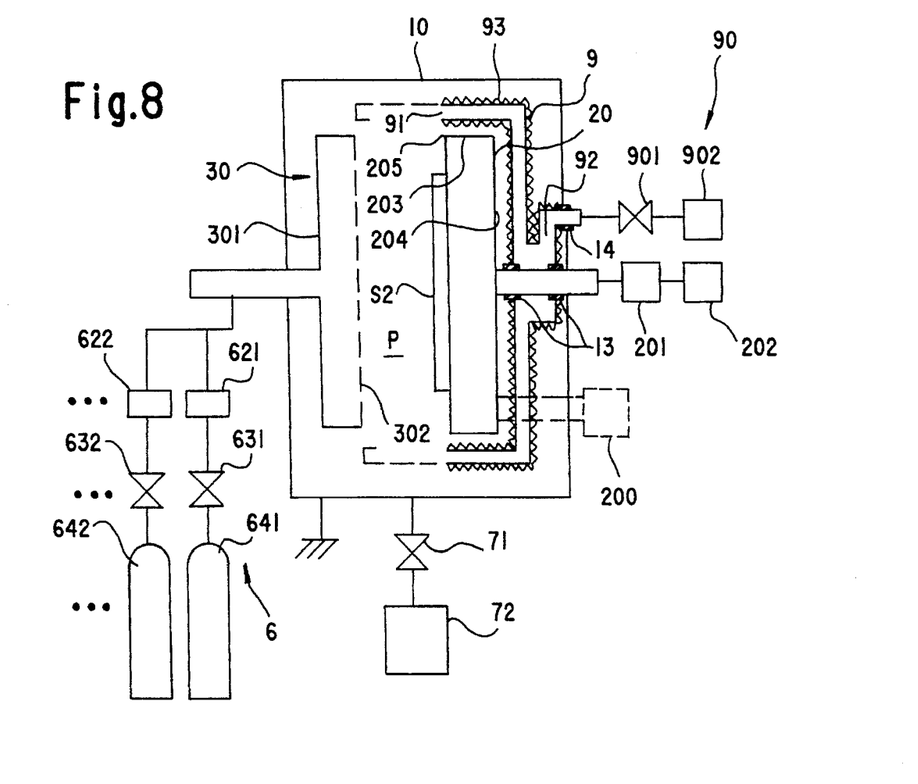
FIG. 8 shows a schematic structure of a plasma etching apparatus of still further another embodiment of the invention.

As another example of the etching apparatus of the invention, the etching apparatus shown in FIG. 7 may include the duct 9 made of an electrically insulating material, or may include the duct 9 of an electrically conductive material to which the insulating spacers 13 and 14 are fitted to make insulation between the duct 9 and the rf-electrode 20 and between the duct 9 and the process chamber 10 as shown in FIG. 8. These etching apparatuses can achieve the same effects as the plasma-CVD apparatus already described. More specifically, these etching apparatuses can improve the uniformity of the etching rate of the film on the substrate S2, so that they can increase a range of the etching conditions achieving the intended uniformity, and improve the etching accuracy. Further, the sizes and cost of the apparatuses can be reduced.

These etching apparatuses may employ such structures that the electrode edge 205 and the duct opening edge are chamfered, a mesh conductive member is arranged at the duct opening and/or the duct is extended to surround the plasma generation region, similarly to those shown in FIGS. 2, 3 and 4. Further, similarly to those shown in FIGS. 6A and 6B, the outer wall at the opening 91 of the duct 9 and the inner surfaces at the corners of the duct may have appropriate configurations allowing smooth movement and discharge of the particles, or purge gas introducing means may be arranged at the corners of the duct. A structure for applying an appropriate potential to the duct may also be employed. Further, means for applying an appropriate voltage to the duct may be provided.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. In a plasma processing apparatus comprising:
   a power application electrode for generating plasma, and
   an electrode opposed thereto disposed in a process chamber which can be set to a vacuum pressure by an exhaust device,
   means to apply electric power to said power application electrode to generate the plasma from a process gas introduced between said electrodes, and
   means to process a plasma on a substrate mounted on one of said electrodes in the plasma,
   the improvement in said apparatus comprising:
   a particle discharge duct which surrounds a periphery and a rear side of said power application electrode and has an opening at a position neighboring to said periphery of said power application electrode; and
   exhaust means connected to said duct at a position corresponding to a central portion of said rear side of said power application electrode.

2. A plasma processing apparatus according to claim 1, wherein said duct is extended to surround a plasma generation region between said electrodes, and said duct opening is extended to a position confronting said plasma generation region.

3. A plasma processing apparatus according to claim 1, further comprising a heater associated to said duct.

4. A plasma processing apparatus according to claim 1, further comprising potential applying means connected to said duct for applying a potential to said opening portion of said duct.

5. A plasma processing apparatus according to claim 2, further comprising potential applying means connected to said duct for applying a potential to said opening portion of said duct.

6. A plasma processing apparatus according to claim 1, further comprising a perforated electrically conductive member provided at said opening of said duct.

7. A plasma processing apparatus according to claim 4, further comprising a perforated electrically conductive member provided at said opening of said duct.

8. A plasma processing apparatus according to claim 5, further comprising a perforated electrically conductive member provided at said opening of said duct.

9. A plasma processing apparatus according to claim 1, wherein an edge of the periphery of said power application electrode near the plasma generation region is chamfered along the direction of suction of particles by said duct.

10. A plasma processing apparatus according to claim 1, wherein an edge of said opening portion of said duct adjacent to said periphery of said power application electrode is chamfered along the direction of suction of particles by said duct.

11. A plasma processing apparatus according to claim 9, wherein an edge of said opening portion of said duct adjacent to said periphery of said power application electrode is chamfered along the direction of suction of said particles by said duct.

12. A plasma processing apparatus according to claim 1, wherein said power application electrode has a square pole form, and said duct is provided at a portion corresponding to the corner of said electrode with purge gas introducing means for preventing accumulation of particles at said portion of said duct.

13. A plasma processing apparatus according to claim 1, wherein said duct is made of an electrically insulating material.

14. A plasma processing apparatus according to claim 1, wherein said duct is made of an electrically conductive material and is electrically isolated from both of said power application electrode and the ground.

15. A plasma processing apparatus according to claim 1, wherein said exhaust means for performing exhaust from said duct is formed of said exhaust device for setting said process chamber to the predetermined vacuum pressure.

16. A plasma processing apparatus according to claim 1, wherein said exhaust means for performing exhaust from said duct is dedicated means provided independently from said exhaust device for setting said process chamber to the predetermined vacuum pressure.

17. A plasma processing apparatus according to any one of claims 1 to 16, wherein said apparatus is a plasma-CVD apparatus.

18. A plasma processing apparatus according to any one of claims 1 to 16, wherein said apparatus is a plasma etching apparatus.

* * * * *